United States Patent [19]
Lowndes et al.

[11] Patent Number: 5,703,341
[45] Date of Patent: Dec. 30, 1997

[54] METHOD FOR ADHESION OF METAL FILMS TO CERAMICS

[75] Inventors: Douglas H. Lowndes, Knoxville; Anthony J. Pedraza, Oak Ridge, both of Tenn.; Melvin J. DeSilva, Ithaca, N.Y.; Rajagopalan A. Kumar, Knoxville, Tenn.

[73] Assignee: Lockheed Martin Energy Systems, Inc., Oak Ridge, Tenn.

[21] Appl. No.: 443,275

[22] Filed: May 17, 1995

Related U.S. Application Data

[63] Continuation-in-part of Ser. No. 156,366, Nov. 23, 1993, abandoned.

[51] Int. Cl.$^6$ .................................................. B23K 26/00
[52] U.S. Cl. .................................................. 219/121.66
[58] Field of Search ................. 219/121.66, 121.68, 219/121.69; 264/400, 405, 482, 409; 427/554, 596, 558; 428/137

[56] References Cited

U.S. PATENT DOCUMENTS

| | | | |
|---|---|---|---|
| 4,241,000 | 12/1980 | Mcauley et al. | 264/65 |
| 4,559,277 | 12/1985 | Ito | 428/627 |
| 4,900,581 | 2/1990 | Stuke et al. | 427/554 |
| 5,100,714 | 3/1992 | Zsamboky | 428/137 |
| 5,198,637 | 3/1993 | Noda et al. | 219/121.69 |
| 5,473,138 | 12/1995 | Singh et al. | 219/121.69 |

OTHER PUBLICATIONS

*Laser Ablation of Electronic Materials*, E. Fogarassy and S. Lazare, 1992.
*Role of interfacial thermal resistance and laser energy density during laser processing of copper–sapphire couples*, M. J. Godbole, A. J. Pedraza, D. H. Lowndes and J. R. Thompson Jr., J. Material Research vol. 7, No. 4, Apr. 1992.

*Primary Examiner*—Geoffrey S. Evans
*Attorney, Agent, or Firm*—David E. LaRose

[57] ABSTRACT

Methods for making strongly bonded metal-ceramic materials. The methods include irradiating a portion of the surface of the ceramic material with a pulsed ultraviolet laser having an energy density sufficient to effect activation of the irradiated surface of the ceramic material so that adhesion of metals subsequently deposited onto the irradiated surface is substantially increased. Advantages of the invention include (i) the need for only a small number of laser pulses at relatively low focused energy density, (ii) a smoother substrate surface, (iii) activation of the laser-treated surface which provides a chemical bond between the surface and a metal deposited thereon, (iv) only low temperature annealing is required to produce the strong metal-ceramic bond; (v) the ability to obtain strong adhesion between ceramic materials and oxidation resistant metals; (vi) ability to store the laser treated ceramic materials for later deposition of metals thereon.

35 Claims, 4 Drawing Sheets

METHOD FOR ADHESION OF METAL FILMS TO CERAMICS

This application is a continuation-in-part of application Ser. No. 08/156,366 filed on Nov. 23, 1993, which is now abandoned.

The United States Government has rights in this invention pursuant to blanket license agreement no. DE-AC05-84OR21400 awarded by United States Department of Energy contract with Martin Marietta Energy Systems, Inc.

BACKGROUND

The present invention relates to ceramic materials and to a method for enhancing the adhesion between the ceramic material and a metal film bonded thereto.

Polycrystalline ceramic bodies, such as alumina (polycrystalline aluminum oxide, p-$Al_2O_3$), are widely used in the electronics industry for metal-film deposition, in packaging applications requiring metal-ceramic bonding and in other industrial applications that include metal-ceramic bonding. Alumina is the most widely used ceramic substrate for electronic applications due to its high strength, moderate thermal expansion coefficient and overall well known manufacturing techniques.

When alumina is selected as the substrate of choice for electrical applications, a very strong metal to ceramic bond (corresponding to an adhesion strength of greater than or equal to 50 MPa) is desired in order to reduce the metallization width and allow for a high density of closely spaced metal lines. With the advent of large-scale integrated circuits and (ICs) and higher packing densities of ICs on multi-chip circuit boards, the space required by the interconnecting metal lines and the reliability of metal-ceramic bonding have become more important. Often, the strength of the metal-ceramic interfacial bonding is the limiting factor in the selection of metal-ceramic bodies for electronic circuits and devices. For weaker metal-ceramic interfacial bonding, wider metal areas are often required to achieve the desired adhesion strength between the metal and ceramic. However, wider lines often reduce the usefulness of various metals in applications where only very fine lines can be used.

For a variety of applications, including electronics utilization, a very smooth surface finish is desired. Irregularities in the surface of the ceramic material may vitiate the effectiveness of the metal deposit, and may prevent proper bonding of the metal and the ceramic. Thus, if the metal deposit in a circuit or device is very thin (for example, from a few tens of nanometers up to a few micrometers), a surface void or discontinuity in the ceramic substrate may render the electrical connection inoperative. However, surface smoothness may not be the only factor affecting the metal-ceramic bonding characteristics.

Although manufacturers of polycrystalline alumina circuit boards strive for a highly uniform, smooth surface, the fundamental limit on surface smoothness is the grain size of the alumina itself. Voids between grains and variations in grain size often produce an irregular surface height profile. Because of the irregular surface height profiles, wider metallization lines are required, particularly for the application of gold, copper and nickel metal films to the alumina substrate, in order to achieve a suitable metal-ceramic bond strength.

Until now, it has been extremely difficult to obtain the required adhesion to ceramic materials of very fine lines of metal films such as gold which do not readily oxidize regardless of the surface smoothness of the ceramic substrate material. Accordingly, adhesion of such oxidation resistant metals to ceramic materials has often required relatively wide metal lines in order to achieve the proper surface adhesion between the metal film and the ceramic substrate.

It is therefore an object of the invention to provide a method for making polycrystalline ceramic bodies having improved or superior metal bonding characteristics.

It is another object of the invention to improve the metal bonding characteristics of ceramic materials, particularly when bonding an oxidation resistant metal to the surface of the ceramic material.

Still another object of the invention is to provide ceramic materials having improved metal bonding characteristics.

Yet another object of the invention is to further improve the adhesion between a deposited metal film and a ceramic material after deposition of the metal film on the surface of the ceramic material.

SUMMARY OF THE INVENTION

With regard to the above and other objects, the present invention provides a method for preparing a surface of an oxide-based ceramic material for deposition of one or more metals thereon. The method comprises irradiating at least a portion of a metal bonding surface of the ceramic material, preferably an oxide-based ceramic material wherein the irradiating is conducted with a laser, preferably a pulsed ultraviolet laser and wherein the irradiating is conducted for a period of time and at an energy density which is sufficient to initiate melting of the irradiated surface.

An energy density "sufficient to initiate melting" means that the energy density is just above the melting temperature of the ceramic material being irradiated. Energy densities high enough to cause ablation of the surface of the ceramic material are not desired and have been found to adversely affect metal film adhesion to the ceramic material. Energy densities lower than that required to initiate melting of the ceramic material may also be used, particularly when depositing metals on the irradiated ceramic surfaces which readily form oxides.

In a preferred embodiment, it has been found that significant improvement in adhesion of metal films to ceramic materials may be achieved by conducting the irradiation of the ceramic material, preferably an oxide-base ceramic material in an oxidizing atmosphere such as air or oxygen. Even further improvement in adhesion of the ceramic material and metal film deposited thereon may be achieved by heat treating the ceramic substrate containing the metal film at an elevated temperature for a period of time sufficient to improve the adhesion relative to the adhesion between the metal and ceramic in the absence of heat treating. In a particularly preferred embodiment, both the irradiation and the heat treating steps are conducted under oxidizing atmospheric conditions.

The present invention provides a truly remarkable, and unexpected increase in the adhesion between a ceramic material and a metal film, particularly between an oxide-based ceramic material and an oxidation resistant metal by use of laser irradiation alone. An "oxidation resistant metal" is a metal having an oxide formation energy of greater than 0. Further improvement may be obtained by post heat treating the metal-ceramic composite for a period of time at an elevated temperature as described herein.

Additionally, the invention relates to articles or bodies of polycrystalline ceramic material having an external surface portion which is activated. The term "activated", or variants thereof herein, is used to signify that the surface has been treated so that sites on the surface have an increased disposition, either chemically or electrically, for bonding to or with metals.

The novel articles mentioned are formed by pulsed laser irradiation, as described more fully hereinafter. The invention further relates to electronic circuits and devices comprising articles, of the type described, to which metal or metal deposits or contacts have been bonded. The ceramic articles of the invention having metal bonded thereto exhibit dramatically increased strength of bonding between the ceramic and metal as determined by standard pull tests. Accordingly, the activation of the surface of the ceramic by the methods disclosed herein promotes a better bond in ways that are not at present clearly understood.

Particular advantages of the process of the invention are that the process may be carried out directly, under ambient conditions, large substrate areas may be processed rapidly, and the metal films may be deposited by any convenient method at any time after irradiation of the ceramic surface.

DESCRIPTION OF THE DRAWINGS

Other features and advantages of the invention are illustrated by the drawings in which.

DETAILED DESCRIPTION OF THE INVENTION

Figure 1:
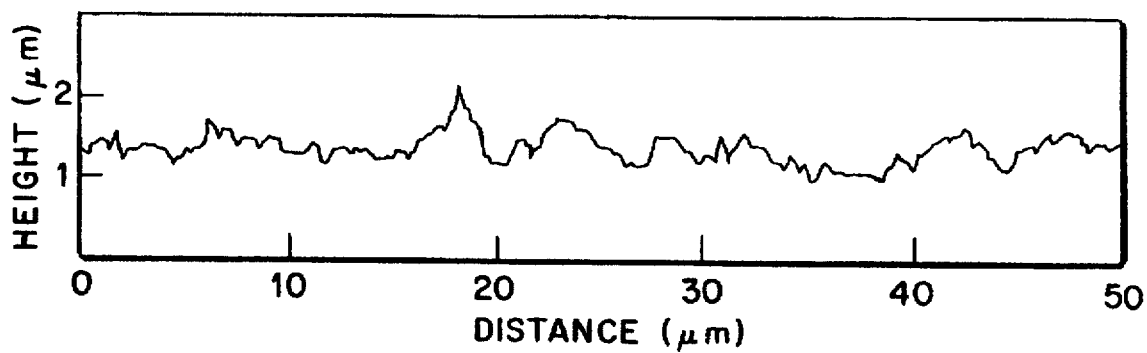
FIG. 1 is a graphic illustration of an atomic force microscope line scan (AFM) profile for polycrystalline alumina in the as-received condition.

In a broad aspect, the invention provides an improved process for adhering metal to the surface of a ceramic material. The process comprises irradiating at least a portion of the surface of the ceramic material with a laser, preferably a pulsed ultraviolet laser, at a low energy density, preferably slightly above the energy density required to initiate melting of the irradiated portion of the ceramic material. After irradiating the surface, a metal is deposited on the irradiated portion of the ceramic material.

The foregoing process has been found to provide a dramatic increase in the adherence of a metal to a ceramic material, particularly when an oxidation resistant metal such as gold is deposited on the ceramic material.

As set forth, the invention provides ceramic bodies having activated surfaces for deposition of metal thereon. Although the preferred aspect of the invention relates to articles or products used in or as electronic components, the invention products are suitable, in general, for any application requiring strongly adherent metal-ceramic bonds. Thus, automotive engine parts, and ceramic-metal components for aerospace applications are within the scope of the invention.

The ceramic materials useful with the invention are preferably polycrystalline ceramic materials such as p-$Al_2O_3$, magnesia, zirconia, spinel, and titania. Other ceramic materials capable of activation include cermets such as the metal carbides, borides, oxides and silicides; silicon, aluminum and boron nitride, and/or fused silica and silica-based glasses. Particularly preferred ceramic materials include oxide-based ceramic materials selected from the group consisting of polycrystalline alumina, strontium-titanium oxide, beryllium oxide, iron oxide, chrome oxide and zirconium oxide. Of the foregoing, polycrystalline alumina is especially preferred.

The size of the portion of the ceramic body which is to be activated is a matter of choice, and will depend on the application. However, it is intended that a significant area of a given surface be activated. In some applications, a ceramic body might have more than one area of activation, or the entire external surface may be activated. In the alternative, well known masking techniques may be used so that activation is only at select locations on the surface of the ceramic material.

The particular metal selected for bonding with the ceramic will be determined by the application intended, and selection thereof is within the ambit of those skilled in the art. The term "metal" herein is understood to include pure metal or metals, metal alloys, intermetallic compounds, and mixtures thereof. Normally, appropriate metals will include, but are not limited to, copper, aluminum, magnesium, tantalum, titanium, silver, palladium, platinum and gold.

In order to form the products of the invention, a polycrystalline ceramic body is initially provided, preferably from a commercial source or by preparation in the manner described in U.S. Pat. No. 4,678,762. At least a portion of the exterior surface of the body is irradiated with a plurality of laser pulses with a laser energy density sufficient to activate the irradiated portion of the surface of the ceramic material so that the bonding strength of the ceramic to a metal is greater than the bonding strength of ceramic to metal in the absence of activation. Irradiation of the surface with a laser energy density slightly above the energy density required to initiate melting of the surface is particularly preferred. Energy densities sufficient to cause ablation of the surface of the ceramic material are preferably avoided as they may result in uneven or pitted surfaces which may reduce the adheshion strength of the metal-ceramic bond.

The number of pulses and energy density which are selected to activate the surface of the ceramic material may be effective to produce localized melting in a layer extending from the exterior of the ceramic body to a few thousand Angstroms into the body, although deeper melting may be effected. Accordingly, the energy density ($E_d$) used to activate the surface of the ceramic body is preferably above the melting-threshold energy density ($E_d^{th}$) for the ceramic material to be activated. In the case of alumina, the $E_d^{th}$ for a pulsed-laser is about 0.7 J/cm². While an energy density slightly above the $E_d^{th}$ is preferred, activation of the ceramic material may be obtained, particularly when bonding copper or nickel to the activated surface of the ceramic material, even at an energy density below the $E_d^{th}$.

The irradiation may be carried out by any suitable pulsed laser. For example, ruby, Nd:YAG; Nd:glass; excimer, and $CO_2$ pulsed lasers may be used. The laser will normally be focused to provide the required energy density. For activating the surface of the ceramic material, the type of laser is not critical, provided that its energy can be coupled into (absorbed within) a very shallow near-surface region. Consequently, it is important that the number of laser pulses and the focused laser energy density, $E_d$, be appropriately selected or sufficient to provide the thin treating or melting area and/or depth required. For example, for the case of an XeCl laser, and p-$Al_2O_3$ substrates, the maximum $E_d$ is about 5 $J/cm^2$ in an oxidizing atmosphere and the optimum number of pulses N is between about and about 5 and about 20. Using the XeCl laser, good activation may be obtained with $E_d$ values much lower than the maximum $E_d$ values suitable for surface activation. For example, $E_d$ ranging from about 0.5 to about 1.5 $J/cm^2$ may effectively activate a polycrystalline $Al_2O_3$ surface for deposition thereon of a gold, copper or nickel film.

Melting may also accompany activation of the surface of the ceramic material. While not desiring to be bound by theoretical considerations, pulsed-laser irradiation of alumina using an energy density greater than the melting-threshold energy density, $E_d > E_d^{th}$, may cause an amorphous region to form from the molten alumina during its rapid solidification following pulsed-laser melting. Adhesion enhancement may be due, therefore, to the large amount of disorder and damage in the amorphous layer as compared to the unirradiated polycrystalline alumina surfaces. It is believed that the amorphous layer contains a large number of sites at which subsequently deposited metal atoms may form strong chemical bonds.

However, there may be more than one physical mechanism by which surface activation occurs in a particular ceramic, so that the choice of laser wavelength generally is expected to be important for activation. For example, another activation mechanism may involve the creation of localized defects, at which sites the electronic energy levels of atoms or molecules are modified, resulting in activation. In this case, pulsed ultraviolet lasers are expected to be advantageous because the higher photon energies of such lasers are more easily and efficiently absorbed in electronic transitions to produce the required defect sites. The defect sites may be sufficient to strongly bond atoms of metals that readily form oxides such as copper or nickel, but without some surface melting, the bonding characteristics of oxidation resistant metals such as gold may not be sufficiently enhanced.

Examples of such lasers which may be used to activate the surface of a ceramic material include pulsed excimer lasers (for example, XeCl, KrF, or ArF operating at photon energies of 4, 0, 5.0 and 6.4 electron volts, respectively), frequency tripled or quadrupled Nd:YAG, or other similar pulsed visible lasers from which pulsed ultraviolet light can be produced by optical harmonic generation. Those skilled in the art may adjust the $E_d$ level and the number of pulses for a given laser and ceramic material for activation thereof given the principles and illustrations provided herein.

While surface activation with a pulsed-laser may be conducted under any suitable atmosphere, it is preferred to irradiate the surface of an oxide-based ceramic material under an oxidizing atmosphere. Oxidizing atmospheres which may be used include, air, oxygen, or mixtures of oxygen and an inert gas such as argon, nitrogen and the like. For depositing a less oxidation resistant metal than gold such as copper or nickel, either an oxidizing or a reducing atmosphere may be used.

Once activated, a metal may be deposited on the activated metal surface by any well known metal deposition technique, such as that described in U.S. Pat. No. 4,436,557, or that in the *Journal of Materials Research*, Volume 2, No. 4, April 1992, pages 1004 through 1010. Thus, in the formation of an electrical circuit or device, the ceramic portion may be provided with a deposit or electrical contacts of one of the aforementioned metals.

After depositing the metal on the activated surface of the ceramic material, the ceramic body containing the deposited metal adhered thereto is preferably heat treated for a period of time and at a temperature sufficient to increase the adhesion between metal and the ceramic material relative to the amount of adhesion obtained between the metal and ceramic material in the absence of heat treating. Heat treating temperatures above about 200° C. and below the melting temperature of the ceramic material may be used. Preferred heat treating temperatures are within the range of from about 250° to about 700° C. and most preferably from about 300° to about 500° C.

The heat treating step is conducted for a period of time sufficient to increase the adhesion between the metal and the ceramic material relative to the amount of adhesion obtained in the absence of the heat-treating step. Suitable periods of time range from about 5 minutes to about 60 minutes or longer. Since the greatest increase in bonding strength is achieved after only a few minutes of heat treating, heat treating times of less than about 60 minutes are preferred.

As with the irradiating step, the heat treating step may also be conducted under any suitable atmosphere. However, for oxide-based ceramic materials, it is preferred to heat treat the ceramic material containing the metal deposited thereon under an oxidizing atmosphere.

Heat treating of the ceramic substrate and metal deposited thereon may be achieved using any well known heat treating apparatus. It is preferred to heat treat the entire ceramic substrate at one time, however, localized heat treating of the portion of the ceramic material may also achieve the desired increase in adhesion strength.

The pressure during the irradiation and heat treating steps is not critical to the invention. Accordingly, either or both of the irradiating and heat treating steps may be conducted under atmospheric, subatmospheric or superatmospheric pressures.

Without intending to limit the invention, the following illustrative examples are provided.

EXAMPLE 1

Commercial p-$Al_2O_3$ thick-film substrates were selected. The sheets were formed by conventional cast-tape process and then fired. The alumina purity was 99.6%, the principal impurities being MgO (0.17%) and $SiO_2$ (0.15%). The as-fired surfaces revealed, by scanning electron microscope (SEM) image, individual grain diameters of from 0.5 μm to nearly 3 m, with most grains in the 1 to 2 μm range. The roughness, measured by Dektak II surface profiler, was about 0.07–0.10 μm, but was considerably larger when viewed by an atomic force microscope (AFM). A pulsed XeCl excimer laser (308 nm, about 41 ns FWHM pulse duration) equipped with uniform-beam electrodes was used to irradiate the substrates at normal incidence. The laser beam was passed through a rectangular aperture to remove its low energy density ($E_d$) fringe and was focused using a single $f_L$=50 cm spherical lens; $E_d$ was controlled by varying the lens-substrate separation. Laser irradiations were carried out in air at atmospheric pressure.

SEM images of the alumina surfaces following irradiation of each in air by 10 XeCl laser pulses at $E_d$ values of 1 to 3 J/cm² showed that, under these conditions, the alumina surfaces melted and underwent molten flow before resolidifying. The $E_d^{th}$ was about 0.7 J/cm², though melting was somewhat non-uniform near the threshold energy density. The flow of molten alumina from 10 laser pulses produced a very smooth $Al_2O_3$ surface. The grain size in the laser-melted region was altered as the grains coalesced and became continuously connected. For $E_d$=4 J/cm² and higher, cracking and pitting of the recrystallized surfaces were evident and the surfaces were covered by elongated frozen droplets of once-molten material that has been redeposited.

Figure 2:
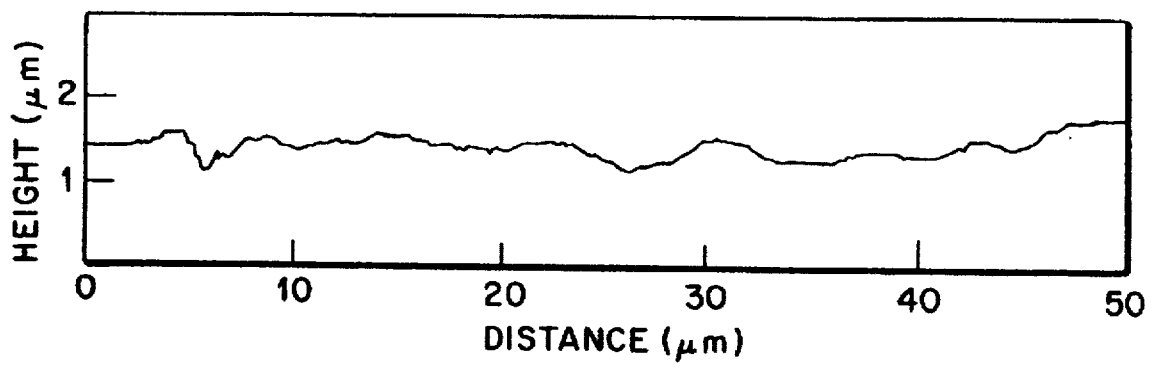
FIG. 2 is a graphic illustration of an atomic force microscope line scan (AFM) profile for polycrystalline alumina after treatment of the alumina with a pulsed laser.

FIG. 1 compares an AFM line-scan profile for p-$Al_2O_3$ in the as-received condition with the AFM line-scan for p-$Al_2O_3$ after 10 XeCl shots at 3 J/cm² illustrated in FIG. 2. The profiles (as well as spatial-frequency transform spectra, not shown) reveal that for repeated irradiation at 3 J/cm² the frequency distribution of surface height variation becomes much narrower, as short-wavelength surface height variations are nearly eliminated. The amplitude of long wavelength surface height variations also decreases slightly, and the laser-treated surface of each substrate becomes much smoother than the original p-$Al_2O_3$ surface. This occurs as adjacent polycrystalline grains are melted and coalesce, becoming continuously connected through the flow of molten alumina.

Following laser irradiation, 300 nm-thick copper films were sputter-deposited onto the laser-treated surfaces, as well as onto untreated surfaces. A standard pull test was used to measure the copper films adhesion to the substrates. The samples were prepared for the pull test by epoxy bonding an epoxy-coated aluminum pin having a pin-head diameter of 0.106 inches to the metal film and curing the epoxy coating at 150° C. for 90 minutes. A commercial pull tester such as the SEASTIAN V pull tester as well as the epoxy-coated aluminum pin may be purchased commercially from the Quad Group, Inc. of Spokane, Wash. The pull test procedures followed were those of the manufacturer of the pull tester. For the examples disclosed herein, the cured epoxy had a maximum fracture strength of approximately 72 MPa which is therefore the maximum adhesion strength that could be measured by this method.

For samples irradiated 10 times, the strength of the copper-alumina bond exhibited a broad maximum near 3 J/cm². Because pull tests are very sensitive to slight misalignment, the adhesion experiments were repeated in order to rule out any spurious effects. The results demonstrated that repeated pulsed XeCl excimer laser irradiation of alumina with $E_d$ about 3 J/cm² not only smoothed the polycrystalline surface, but also improved the strength of subsequent copper-alumina (metal-ceramic) interfacial bonding by a factor of between 3 and 5 (200% to 400%). As noted above, rougher surfaces were obtained for both higher and lower $E_d$ values, and are correlated with weaker adhesion. The improvement in the strength of the metal-ceramic bond occurred for metal films that were deposited after laser irradiation of the alumina substrate. While not wishing to be bound by any theory of invention, it appears that the alumina surface may have been electrically (chemically) activated by laser treatment, in addition to any ancillary smoothing that may have occurred.

EXAMPLE 2

Polycrystalline alumina bodies were irradiated using a pulsed laser of the type described. The untreated bodies contained a high density of defects or voids, i.e., the grain boundaries and irregular crystalline facets that exist on the micrometer scale (as well as trace chemical impurities) which coupled with even initial laser pulses. After a small number, for example, 1 or 2, of "incubation" pulses, smoothing and activation of the bodies were achieved at 2 J/cm² after 5 pulses, and at 3 J/cm² after 4 pulses. As will be evident to those skilled in the art, smooth substrates activated for enhanced adhesion can be prepared in advance of deposition of a metal layer of arbitrary thickness.

EXAMPLE 3

Polished polycrystalline alumina specimens (99.6 wt. % pure) were cut from sheets of polished polycrystalline alumina type ADS-996, LUSTRA-SURF thin-film substrates from the Coors Ceramic Company of Golden, Colorado. The specimens were irradiated with ten consecutive pulses from a pulsed XeCl (308 nm) laser, for each of the series of $E_d$ values selected. Irradiations were performed in argon containing 4 vol. % hydrogen, in air and in oxygen at atmospheric pressure. Gold films, 80 nm thick were then sputter-deposited on the irradiated surface of the alumina using 10 kV $Ar^+$ions under an argon pressure of $5\times10^{-5}$ Torr. Adhesion tests of the metal coating were performed using a pull tester and the test procedure described above in Example 1.

Figure 3A:
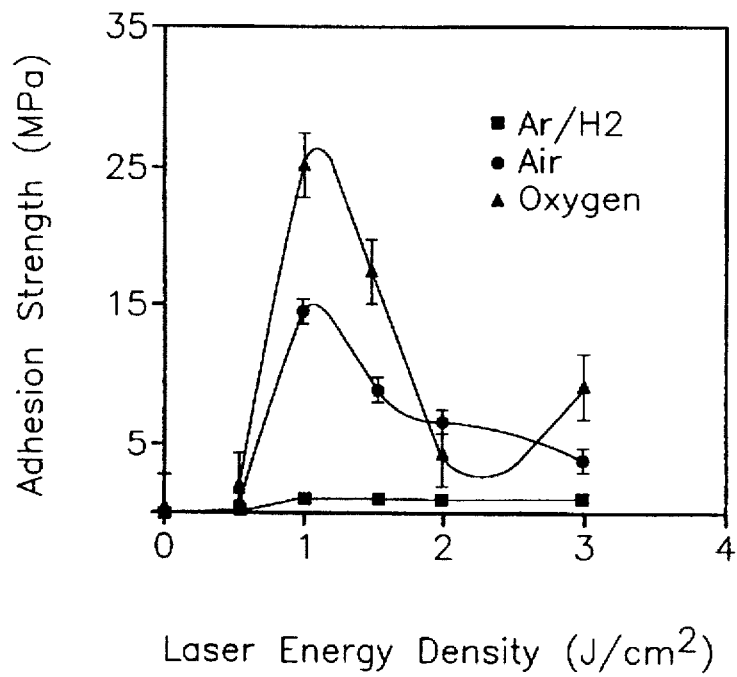
FIG. 3A is a graphic illustration of the adhesive strength between gold and a ceramic material under various irradiation conditions.
Figure 3B:
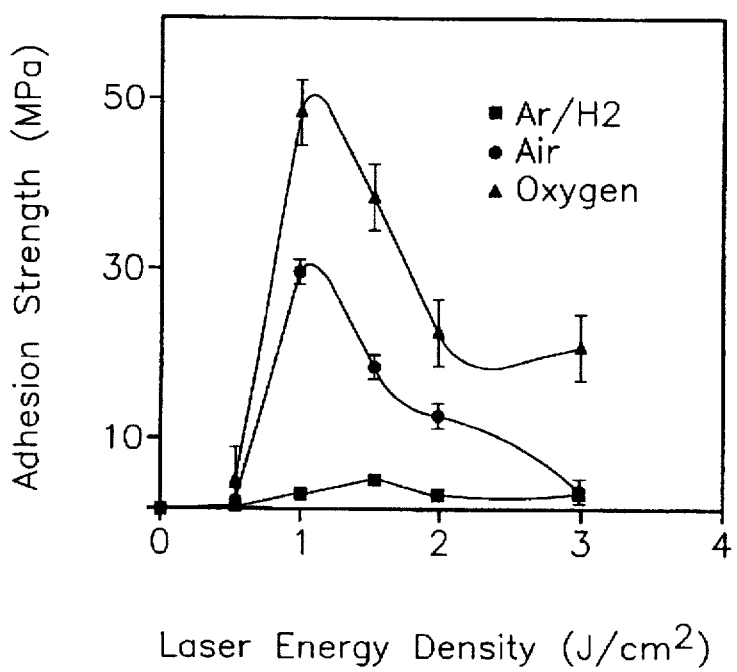
FIG. 3B is a graphic illustration of the adhesive strength between gold and a ceramic material under various irradiation conditions after a post heat treating step.

FIG. 3A illustrates the gold-alumina adhesion strength obtained as a function of the laser $E_d$ while maintaining atmospheric pressure during laser irradiation. FIG. 3B illustrates the effect of subsequent heat treating of the metal deposited ceramic material at a temperature of 300° C. for one hour.

The adhesive strength obtained by laser irradiation of the ceramic and/or heat treating of the ceramic and metal may be compared to the normally weak (about 0.1 MPa) adhesion strength of a gold film sputter-deposited onto a polished, polycrystalline alumina substrate in the absence of irradiation of the ceramic surface.

As illustrated by FIGS. 3A and 3B, laser irradiation of the alumina substrate greatly improves the adhesion of subsequently deposited gold films. For substrates irradiated in a reducing atmosphere (argon plus 4 vol. % $H_2$), the maximum gold-aluminum adhesion strength was 1.2 MPa at $E_d$=1.5 J/cm² (FIG. 3A) which is an improvement by a factor of 12 over gold deposited on an unirradiated alumina substrate. Post heat treating of the gold-alumina material at 300° C. for one hour improved the adhesion strength further to 3 MPa (FIG. 3B) in an argon-hydrogen atmosphere which is about 30 times better than the adhesive strength of gold deposited on an unirradiated ceramic surface.

Further improvement was achieved by irradiating the ceramic in an oxidizing atmosphere as illustrated by (FIG. 3A). In air and in pure oxygen, maximum adhesion strengths of about 14 MPa and about 27 MPa, respectively were obtained for an $E_d$ slightly greater than 1 J/cm² (FIG. 3A), without any post heat treatment of the metal-ceramic composite. As compared to the adhesion values obtained under a reducing atmosphere, the adhesion values were more than an order of magnitude larger for the alumina substrate irradiated under an oxidizing atmosphere.

As illustrated by FIG. 3A, the functional dependence between adhesion strength and laser density, $E_d$, is similar for all three atmospheric conditions used, but the magnitude of the resulting bond strength is much greater when the irradiation is conducted in an oxidizing atmosphere.

FIG. 3B illustrates that the adhesion strength of a gold film to an alumina substrate is greatly increased by subsequently heat treating the alumina containing the gold film regardless of whether the irradiation of the substrate is effected under an oxidizing or a reducing atmosphere. Furthermore, the post heat treating process does not appear to alter the functional dependence of adhesion strength to $E_d$.

As illustrated by FIGS. 3A and 3B, the adhesion strength of gold films deposited on an alumina substrate decreases for $E_d$ greater than or equal to 2 J/cm². At $E_d$ values above about 2 J/cm², significant ablation of alumina begins to occur, creating pits and macroscopic surface roughening that may effectively interfere with the gold-alumina adhesive bond.

Figure 4:
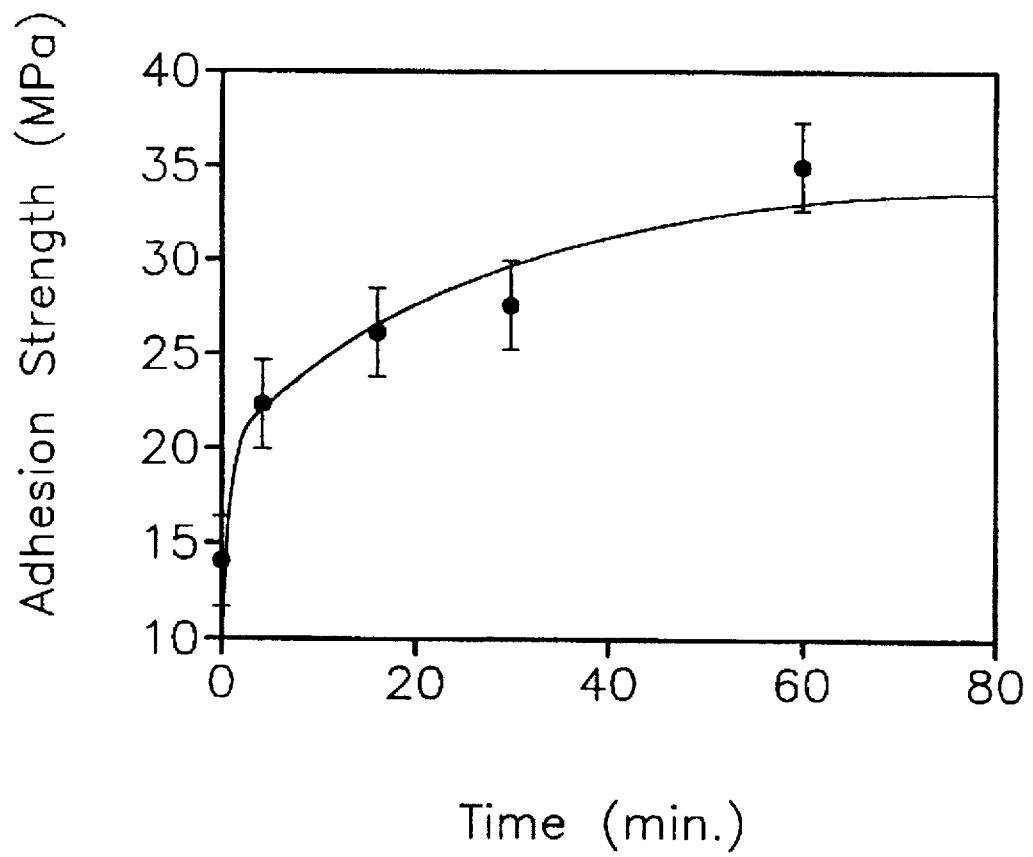
FIG. 4 is a graphic illustration of the increase of adhesion between gold and a ceramic material as a function of heat treating time.

The effect of post heat treating time on the adhesion strength for gold films deposited on alumina substrates is illustrated in FIG. 4. It has been found that the adhesion strength increases rapidly for short post heat treating times, but asymptotically reaches a maximum for times greater than about 60 minutes. Thus, most of the adhesion improvement is obtained after only a short post heat treating period of time.

For comparison purposes, a gold film which was deposited on an alumina substrate that had not be laser irradiated was heat treated at 300° C. for one hour. There was no improvement in adhesion strength as illustrated by the adhesion strength at $E_d=0$ in FIG. 3B.

While the process of the present invention is particularly useful for improving the adhesion strength between oxidation resistant metals such as gold and a ceramic material, improvement in the adhesion strength may also be obtained for less oxidation resistant metals such as copper and nickel. The following example illustrates the applicability of the invention to the deposit of copper and nickel on alumina substrates.

EXAMPLE 4

Polished polycrystalline alumina substrates as used in Example 3, were laser irradiated 10 times each in air or in argon containing 4 vol. % hydrogen using various $E_d$ energy densities. Subsequently, 80 nm thick copper or nickel films were ion-bean sputter-deposited on the laser-irradiated substrates. One set of the copper/alumina pairs was heat treated at 500° C. for one hour; one set of the nickel/alumina pairs was heat treated at 300° C. for one hour. The higher temperature heat treating was done for copper in order to test the thermal stability of the films. The higher heat treating temperature was found to decrease the electrical resistivity of the copper film relative to the electrical resistivity of the copper film absent the post heat treating step.

Figure 5:
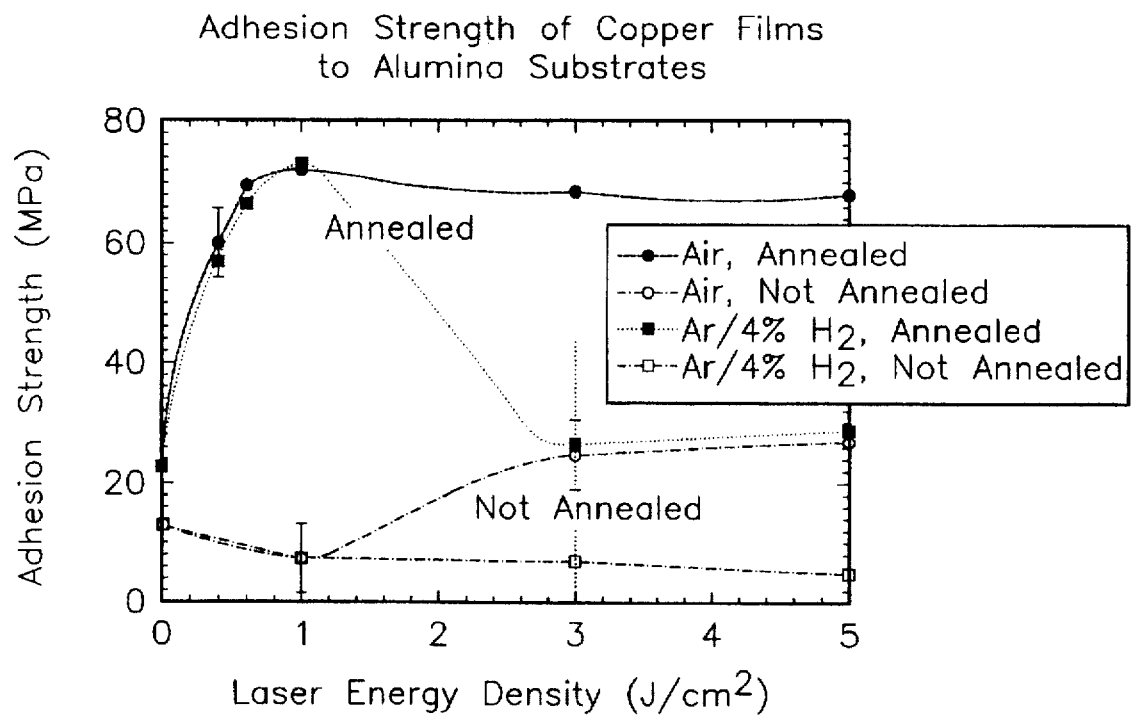
FIG. 5 is a graphic illustration of the increase in adhesive strength between copper and alumina substrates under various conditions.

FIG. 5 summarizes the adhesion strengths obtained for copper films that were deposited on laser-irradiated alumina substrates at various $E_d$ values under both oxidizing and reducing atmospheres. At $E_d=0$ (no laser irradiation), the as-deposited copper films had an adhesion strength of about 13 MPa which was much higher than that for an as-deposited gold film (FIGS. 3A and 3B). Unlike the gold film, however, heat treatment of the copper-alumina substrate without laser treatment increased the adhesion strength to about 22 MPa. After laser irradiation using an XeCl laser pulse as described in Example 3, followed by heat treating, there was a rapid increase in the adhesion strength with increasing $E_d$ with the maximum adhesion strength being obtained at an $E_d$ of about 1 J/cm² under both oxidizing and reducing atmospheres.

Because the pull-test failure of the copper-alumina composites which were laser irradiated and heat treated never occurred at the copper/alumina interface, the maximum adhesion values shown for these samples in FIG. 5 were the values for the epoxy bond used in the pull test procedure. Thus the actual maximum adhesion strength values for copper-alumina composites that were laser irradiated and heat treated are presently unknown.

Figure 6:
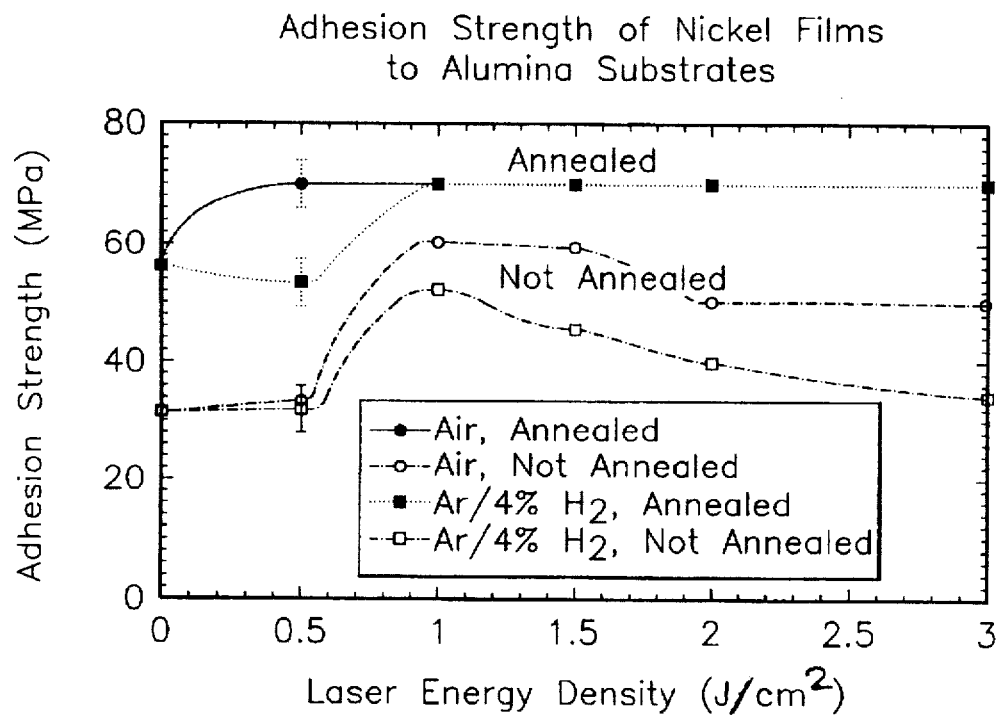
FIG. 6 is a graphic illustration of the increase in adhesive strength between nickel and alumina substrates under various conditions.

FIG. 6 summarizes the adhesion strengths obtained for nickel films deposited on alumina substrates that were laser-irradiated at various $E_d$ values in air and in argon containing 4 vol. % hydrogen under both oxidizing and reducing atmospheres. At $E_d=0$ (no laser irradiation), the as-deposited nickel films had an adhesion strength of about 32 MPa which was much higher than that for an as-deposited gold film (FIGS. 3A and 3B) and the as-deposited copper film (FIG. 5). As with the copper film, heat treatment of the nickel-alumina substrate without laser treatment increased the adhesion strength to about 55 MPa. After laser irradiation using an XeCl laser pulse as described in Example 3, followed by heat treating, there was an increase in the adhesion strength to the pull test experimental limit with increasing $E_d$. Accordingly, laser irradiation with an $E_d$ of about 1 J/cm² under both oxidizing and reducing atmospheres is sufficient to reach the maximum measurable adhesion strength. For nickel-alumina composites produced without the heat treating step, the maximum adhesion strength was obtained at an $E_d$ of about 1 J/cm².

As demonstrated by the foregoing examples, the process of the invention may be carried out in air, and thus, may be scaled up readily without the need to provide an exotic atmosphere for laser processing. Furthermore, because of the high average power of modern pulsed lasers, very high surface-processing rates are possible by raster-scanning the laser beam to cover a large area. For example, if only half of 50 Watt eximer laser's optical output power is delivered to a substrate with 10 laser pulses at an energy density of 1 J/cm², the entire area of a standard 9.5×11.5 cm² alumina circuit board may be laser-process in only about 44 seconds. If only 10% of the circuit board's area is to be activated, then the laser processing time may be cut to less than 5 seconds.

Laser activation of a ceramic surface may be carried out in advance then the activated ceramic material may be stored for later use. Accordingly, metallization may be done at any convenient time or at another site using any suitable metal-deposition technique. Furthermore, the heat treating step may also be conducted at a later time and at another location.

Because the pulsed laser beam is focused, activation of the ceramic surface may be selective and thereby limited to specific substrate areas, if desired, by scanning the laser beam and/or by using masking techniques so that a subsequently deposited metal is strongly bonded only to the laser-irradiated area or areas of the substrate. For metals such as gold, for which adhesion to a ceramic material is normally quite weak in the absence of laser irradiation, production of gold-ceramic composites may be simplified. Accordingly, the gold can be applied to the whole surface of the substrate by spraying or screening techniques, yet may be easily removed from the non-irradiated areas of the substrate, even after heat treating the metal-ceramic composite.

Having described the invention and the preferred embodiments thereof, it will be recognized by those of ordinary skill that variations in the invention are within the spirit and scope of the appended claims.

What is claimed is:

1. A method for improving adhesion between an oxide-based ceramic material and metal deposited thereon comprising:

irradiating a metal bonding surface of the oxide-based ceramic material with a laser for a period of time and at an energy density above an energy density required to initiate melting of the irradiated surface of the oxide-based ceramic material in order to decrease the surface roughness of the metal bonding surface;

depositing one or more metals on the irradiated surface of the ceramic material; and subsequently heat treating the ceramic material containing the metal at a temperature ranging from about 250° to about 700° C. for a period of time sufficient to increase the adhesion between the metal and the oxide-based ceramic material relative to the adhesion of the metal to the oxide-based ceramic material in the absence of heat treating.

2. The method of claim 1 wherein the laser is a pulsed ultraviolet laser.

3. The method of claim 1 wherein the oxide-based ceramic material is selected from the group consisting of polycrystalline alumina, strontium-titanium oxide, beryllium oxide, iron oxide, chrome oxide and zirconium oxide.

4. The method of claim 3 wherein the oxide-based ceramic material is polycrystalline alumina.

5. The method of claim 4 wherein the energy density is in a range of from about 0.7 to about 1.5 J/cm$^2$.

6. The method of claim 1 wherein the irradiation is conducted under an oxidizing atmosphere.

7. The method of claim 6 wherein the heat treating step is conducted under an oxidizing atmosphere.

8. The method of claim 1 wherein the heat treating step is conducted under an oxidizing atmosphere.

9. The method of claim 1 wherein the metal has an oxide formation energy of greater than 0.

10. The method of claim 1 wherein the metal is selected from the group consisting of gold, copper and nickel.

11. The method of claim 1 wherein the heat treating step is conducted at a temperature within the range of from about 300° to about 500° C.

12. The method of claim 11 wherein the heating treating step is conducted for a period of time ranging from about 5 minutes to about 60 minutes.

13. An oxide-based ceramic material having a deposit of metal chemically bonded thereto made by the method of claim 1 wherein the metal bonding surface is irradiated with an energy density ranging from about 0.5 to about 1.5 J/cm$^2$ and the adhesion strength between the metal and ceramic is greater than about 20 MPa.

14. A process for adhering metal to a surface of a ceramic material comprising:

irradiating at least a portion of the surface of the ceramic material with a pulsed ultraviolet laser at an energy density above an energy density required to initiate melting of the irradiated portion of the ceramic material in order to decrease the surface roughness of the metal bonding surface; and depositing metal on the irradiated portion of the ceramic material.

15. The process of claim 14 wherein the ceramic material is an oxide-based ceramic material.

16. The process of claim 15 wherein the ceramic material is irradiated under an oxidizing atmosphere.

17. The process of claim 15 wherein the oxide-based ceramic material is polycrystalline alumina.

18. The process of claim 17 wherein the energy density is in a range of from about 0.7 to about 1.5 J/cm$^2$.

19. The process of claim 15 wherein the oxide-based ceramic material is selected from the group consisting of polycrystalline alumina, strontium-titanium oxide, beryllium oxide, iron oxide, chrome oxide and zirconium oxide.

20. The process of claim 14 further comprising the step of heat treating the ceramic material and metal deposit at a temperature and for a period of time sufficient to increase the adhesion between the metal and ceramic material relative to the adhesion of the metal to the ceramic material in the absence of heat treating.

21. The process of claim 20 wherein the heat treating step is conducted under an oxidizing atmosphere.

22. The method of claim 20 wherein the heat treating step is conducted at a temperature within the range of from about 300° to about 500° C.

23. The method of claim 20 wherein the heating treating step is conducted for a period of time ranging from about 5 minutes to about 60 minutes.

24. An oxide-based ceramic material having a deposit of a non-oxide forming metal chemically bonded thereto made by the method of claim 20 wherein the metal bonding surface is irradiated with an energy density ranging from about 0.5 to about 1.5 J/cm$^2$ and the adhesion strength between the metal and ceramic is greater than about 20 MPa.

25. The process of claim 14 wherein the metal has an oxide formation energy of greater than 0.

26. The process of claim 14 wherein the metal is selected from the group consisting of gold, copper and nickel.

27. An oxide-based ceramic material having a deposit of a non-oxide forming metal chemically bonded thereto made by the method of claim 14 wherein the metal bonding surface is irradiated with an energy density ranging from about 0.5 to about 1.5 J/cm$^2$ and the adhesion strength between the metal and ceramic is greater than about 20 MPa.

28. A method for preparing a surface of an oxide-based ceramic material for deposition of one or more metals thereon comprising irradiating at least a portion of a metal bonding surface of the oxide-based ceramic material wherein the irradiating is conducted with a pulsed ultraviolet laser for a period of time and at an energy density which is sufficient to initiate melting of the irradiated surface in order to decrease the surface roughness of the metal bonding surface and to provide a surface which forms chemical bonds with metal deposited thereon.

29. The method of claim 28 wherein the irradiating is conducted in an oxidizing atmosphere.

30. The method of claim 29 wherein the oxide-based ceramic material is selected from the group consisting of polycrystalline alumina, strontium-titanium oxide, beryllium oxide, iron oxide, chrome oxide and zirconium oxide.

31. The method of claim 30 wherein the irradiating is conducted in an oxidizing atmosphere.

32. The method of claim 29 wherein the oxide-based ceramic material is polycrystalline alumina.

33. The method of claim 32 wherein the irradiating is conducted in an oxidizing atmosphere.

34. The method of claim 33 wherein the laser energy density ranges from about 0.7 to about 1.5 J/cm$^2$.

35. An oxide-based ceramic material for use in electronics applications made by the process of claim 28 wherein the metal bonding surface is irradiated with an energy density ranging from about 0.5 to about 1.5 J/cm$^2$ to produce an activated surface which provides an adhesive strength between the surface and a metal subsequently deposited thereon of greater than about 20 MPa.

* * * * *